United States Patent [19]

Hashimoto

[11] Patent Number: 5,179,439
[45] Date of Patent: Jan. 12, 1993

[54] PERSONAL CHANNEL DISPLAY DEVICE IN A TV PROGRAM RESERVATION SYSTEM

[75] Inventor: Kazuo Hashimoto, Tokyo, Japan

[73] Assignee: Hashimoto Corporation, Tokyo, Japan

[21] Appl. No.: 569,258

[22] Filed: Aug. 16, 1990

Related U.S. Application Data

[63] Continuation of Ser. No. 340,309, Apr. 18, 1989, abandoned.

[30] Foreign Application Priority Data

Feb. 5, 1988 [JP] Japan ................ 63-109783

[51] Int. Cl.⁵ ............................................. H04N 7/10
[52] U.S. Cl. ...................................... 358/86; 455/4.1; 379/105
[58] Field of Search ................ 358/84, 86; 455/4, 5; 379/104, 105

[56] References Cited

U.S. PATENT DOCUMENTS

| | | | |
|---|---|---|---|
| 4,081,753 | 3/1978 | Miller | 358/84 X |
| 4,081,754 | 3/1978 | Jackson . | |
| 4,228,543 | 10/1980 | Jackson | 358/191.1 X |
| 4,540,851 | 9/1985 | Hashimoto | 379/105 |
| 4,686,564 | 8/1987 | Masuko et al. | 358/86 |
| 4,706,121 | 11/1987 | Young | 358/142 |
| 4,710,969 | 12/1987 | Fluck, Jr. et al. | 358/86 |
| 4,745,549 | 5/1988 | Hashimoto | 358/84 X |
| 4,908,707 | 3/1990 | Kinghorn | 358/147 |
| 4,977,455 | 12/1990 | Young | 358/142 |

FOREIGN PATENT DOCUMENTS

| | | | |
|---|---|---|---|
| 62-278867 | 12/1987 | Japan | 455/603 |
| 63-244962 | 10/1988 | Japan | 379/104 |
| 63-246070 | 10/1988 | Japan | 379/104 |
| 2034995 | 6/1980 | United Kingdom . | |
| 2179771 | 3/1987 | United Kingdom | 358/84 |

*Primary Examiner*—James L. Dwyer
*Assistant Examiner*—Wing F. Chan
*Attorney, Agent, or Firm*—Lowe, Price, Le Blanc & Becker

[57] ABSTRACT

In a TV program reservation system for reserving a TV program suitable to an individual's taste, a reserved TV channel number is always displayed on a display unit of a TV set, and an alarm signal can be generated when a reserved time comes so as to inform a person watching any program by manual operation, that the reserved time has arrived. On each of four divided display portions of the display unit, it is possible to display each of the reserved channels for family members, each of the reserved channels during a predetermined interval of time for an individual, or a channel and a code number when all TV programs are classified into corresponding digits. Further, a user can obtain the displayed channel by voice or other indication via telephone from a remote location.

7 Claims, 6 Drawing Sheets

(EXAMPLE OF DATA SENT TO CENTER)

FIG. 8

(EXAMPLE OF DATA SENT FROM CENTER)

FIG. 9

PERSONAL CHANNEL DISPLAY DEVICE IN A TV PROGRAM RESERVATION SYSTEM

This application is a continuation of application Ser. No. 07/340,309 filed Apr. 18, 1989, abandoned.

BACKGROUND OF THE INVENTION

The present invention relates to a personal channel display device in a TV program reservation system.

Regarding conventional individual TV program reservation systems, various systems exist. In one of them, questionnaires submitted from individual subscribers on TV programs are evaluated and evaluation results are processed by linear programming. In this way, an individual timing table for 24 hours is printed out and stored in a disk to be sent out to a TV set or VCR through a personal computer, so that a desired TV program is reserved (preselected). According to U.S. Pat. No. 4,540,851 by the same applicant, the VCR is remotely controlled immediately by telephone, or a program that will air some hours later is reserved. Further, in the German VPT system, a code number specified to an individual TV program is stored, and when it coincides with a reservation code sent from a TV station, recording is automatically started.

Each of said TV program reservation systems has its advantages and disadvantages, so that which of them will hold a dominant position in the future is left to the selection of a large majority of subscribers. But at any rate, if the subscriber reserves some programs in a day, various inconsistencies are caused between a reserved TV channel and a channel which the subscriber is now watching at his home (hereinafter called a manual mode). In a VCR, if the subscriber at home releases the reservation mode and switches to the manual channel mode, the reserved channel is not turned on at the reservation time, so that he may miss an important reserved program. In case of reservation of the VCR from a remote location by telephone, if the subscriber's family at home is watching on the VCR in the manual mode when the subscriber tries to make a reservation, it is impossible to accept his reservation, so that the system is not useful.

Further, the German VPT system seems to be useful for its automatic operation, but this operation is possible for only one TV station. The VCR of each individual can be controlled by a station, but if another program of any other station is controlled, there will be an infringement and a legal problem will occur. It is supposed that a method can be applied wherein a code number is specified to each TV station thereby to control the program of each station if the stations are not so many. But if the stations amount to 50, as in the USA, this method will cause private information control and adjustment among the stations to be impossible. Moreover, the previously mentioned problem between automatic and manual operation still remains.

It may be rather inconvenient if the program shifts from the manual mode to the reserved mode when the reservation time occurs. At that time, even if the user manually releases the reserved channel, the program in the manual mode is interrupted for at least about one minute.

Conventional TV channel reservation systems have the various disadvantages as described above. The present invention provides a new means to eliminate said disadvantages.

SUMMARY OF THE INVENTION

It is an object of the present invention to display at every moment the number of a reserved TV channel of a TV set or VCR, on a good-sized display unit, so that all family members can easily read the channel number.

It is another object of the present invention to make it possible to watch the TV or VCR by manual operation for a home user without any disturbance by the display unit, and enable the user to switch manually to a channel on said display unit if he wants to watch it, and also easily carry out an operation of the reserved channel after the user switches to an auto mode.

It is a further object of the present invention to generate an alarm signal for a couple of seconds when the channel display on said display unit changes so as to inform any person therearound.

It is a further object of the present invention to generate an alarm signal or flash the channel display for a couple of seconds when the reservation time arrives while persons are watching any program by manual operation at home, so as to call their attention to the reserved program.

It is a further object of the present invention to divide said display unit into four portions, and display simultaneously the reserved channel of each family member on each of said portions; for instance, on said first portion the reserved channel of the user, on said second portion his wife's channel, and on said third and fourth portions the children's channels, so that each member of the family in a living room can easily select his or her desired channel.

It is a further object of the present invention to divide said display unit into two sections when all TV programs are classified into two digits, up to a maximum of 99 in Germany or any other country, so as to make it possible to display on the first portion the channel number, for instance, 6, on the second portion the class number, for instance, 22, and on the third and fourth portions the channel and class numbers at the next time, for instance, 4 for the channel and 17 for the class, respectively.

It is a further object of the present invention to make it possible to display each of four channel numbers of TV programs for each individual at every 15 minute interval in the individual TV program system in above first object, for instance, 3rd channel from now to 15 minutes later, 5th channel from 15 minutes to 30 minutes from now, 8th channel from 30 minutes to 45 minutes from now and 1st channel from 45 minutes to 60 minutes from now.

It is a further object of the present invention to enable the user to obtain the displayed channel in said reserved system by voice or other indication via telephone from a remote location.

The above and other objects, features and advantages of the present invention will become more apparent from the following description when taken in conjunction with the accompanying drawings in which preferred embodiments of the present invention are shown by way of illustrative example.

BEST MODE FOR PRACTICING THE INVENTION

Figure 1:
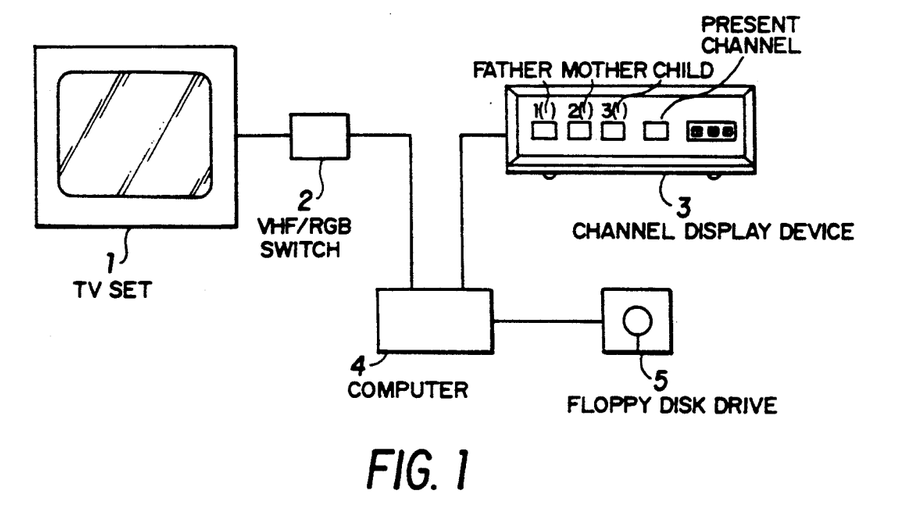
FIG. 1 is a principle view of a first preferred embodiment of the invention.

The theory and structure of a first twenty four hour reservation system will be now described as follows. In FIG. 1, showing the theory of this system, 1 denotes a TV set, 2 denotes a VHF/RGB switching switch, and 3 denotes a channel display device Numeral 4 denotes a computer, and 5 denotes a floppy disk drive.

As above, in the system, a floppy diskette which records channel data which is suitable to the interest of each person in each family is set to the floppy diskette drive 5, and a floppy diskette is controlled by the computer 4. Channel data of each person written in the floppy diskette is read out automatically, and the channel data is displayed on the channel display device 3.

The computer 4 can read out the channel data of the present time from a TV program data input in the floppy diskette, and display it on the channel display device 3, and at the same time can display on a braun tube or the like all the channel data prepared for each person and input in the floppy diskette. Namely, the channel data prepared for each person on the braun tube can be displayed at any time, when each person in the family desires it. It is possible to confirm condition of the channel data at any time by scrolling the channel data displayed on the braun tube, and the channel data can be revised by operating manually the computer as occasion demands of each person, with each person watching the channel data on the braun tube. The channel data selected newly by the revision thereof is input to the floppy diskette, and it is displayed on the display device immediately.

The channel data prepared for each person is displayed on the TV set by switching the VHF/RGB switch 2 to the RGB side. As a result, the picture of TV set 1 is shifted from a TV program to one controlled by the computer 4. After it has been displayed on one line of the braun tube of the TV set 1 when the channel data prepared for each person on the floppy diskette returns to the TV program, this operation similarly is carried out by manual switching.

The channel display device 3 in FIG. 1 is a display device for the channel data for each person. However, it is possible to display the channel data for many persons in the family on the channel display device 3 by a variation thereof For example, it can display the channels of the father, mother and children as a family unit, or the channel of each fifteen minute interval, or the channel and the code number of a TV program in a country such as West Germany.

Figure 2:
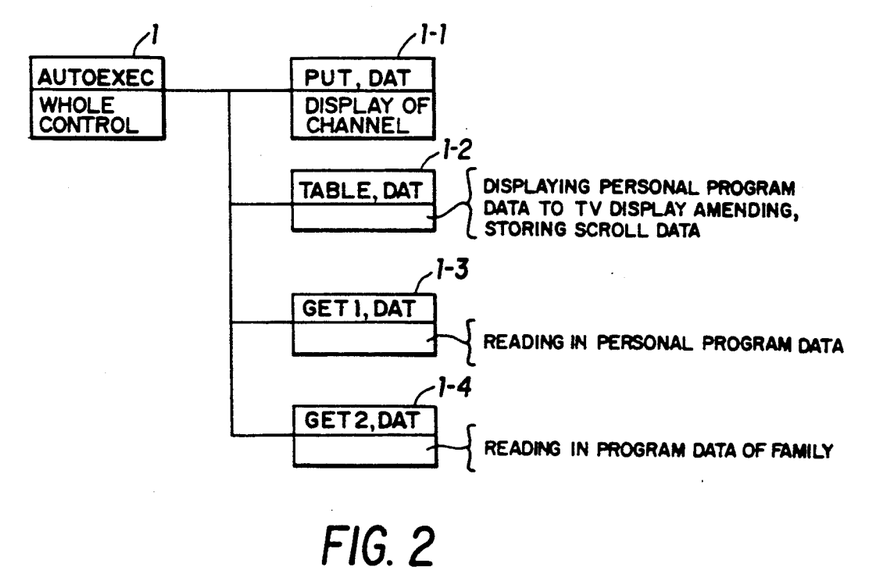
FIG. 2 is an explanatory view of the entire program of the first preferred embodiment of the invention.

The construction of an entire program of this system will be described in accordance with FIG. 2. The letters on the upper side of the block of each element in FIG. 2 denote the names of executed programs; a summary of the functions and operations of the programs are described on the lower side of the blocks. Program 1 controls the pertinent connection of each device and the proper operation of each device when the computer is set to ON and starts to be operated The program 1-4 reads the present time, and calculates the channel data prepared for personal use which should be displayed in accordance with the present time read by the program 1-4. The corresponding channel data on the present time is read in from the floppy diskette. The program 1-1 displays the channel data on an indicator. When a TV viewer wants to display all of the channel data of a person on the braun tube or to revise a part of the data, the program 1-3 reads in all of the channel data of a corresponding person to the computer from the floppy diskette, and the program 1 revises the data in accordance with all of the channel data read in.

Figure 3:
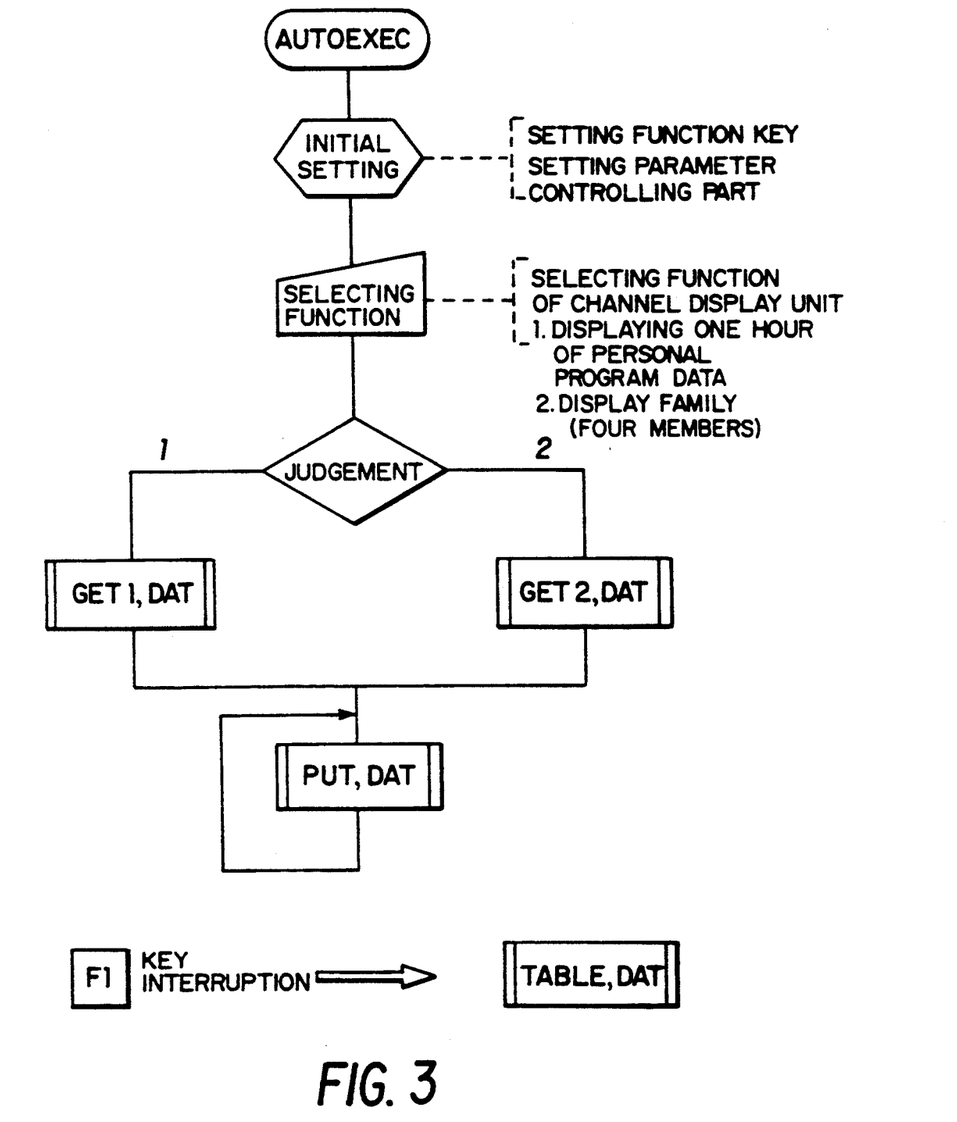
FIG. 3 is a detailed flow chart of each sub-program of the invention.

A flow chart of each program will be described with reference to FIG. 3. As shown therein, this program runs as soon as the computer is switched on, and controls the whole operation of the computer. First, the program AUTOEXEC is operated, and selects a subject displayed on the channel display device 3 in FIG. 1. The program AUTOEXEC selects whether the channel data of one person for one hour is displayed by using all of four indicators, or each of the plural channel data of the family is displayed on each indicator. The program (1-1 in FIG. 2) reads in corresponding data from the floppy diskette to the computer and displays the requisite channel data on the channel display device The display of the channel data shifts to the proper channel data upon every fifteen minute interval.

When a TV viewer wants to refer to all of the channel data prepared for each person when a TV viewer watches the television, the TV viewer can refer to all the channel data by pushing the F-1 key on the keyboard of the computer. At this time, the computer determines that an interruption occurs in the present operation, and the program (TABLE.DAT) comes automatically into operation by the computer.

It is possible to refer and/or to revise all of the channel data by the program. This operation is operated in accordance with the flow chart in FIG. 4. Namely, the table for displaying the channel data is displayed on the CRT of the television. The function on the keyboard of the computer for scrolling or revising the channel data is assigned. The corresponding time is calculated by a timer in the computer, and the channel data corresponding to the time is described on the table.

Figure 4:
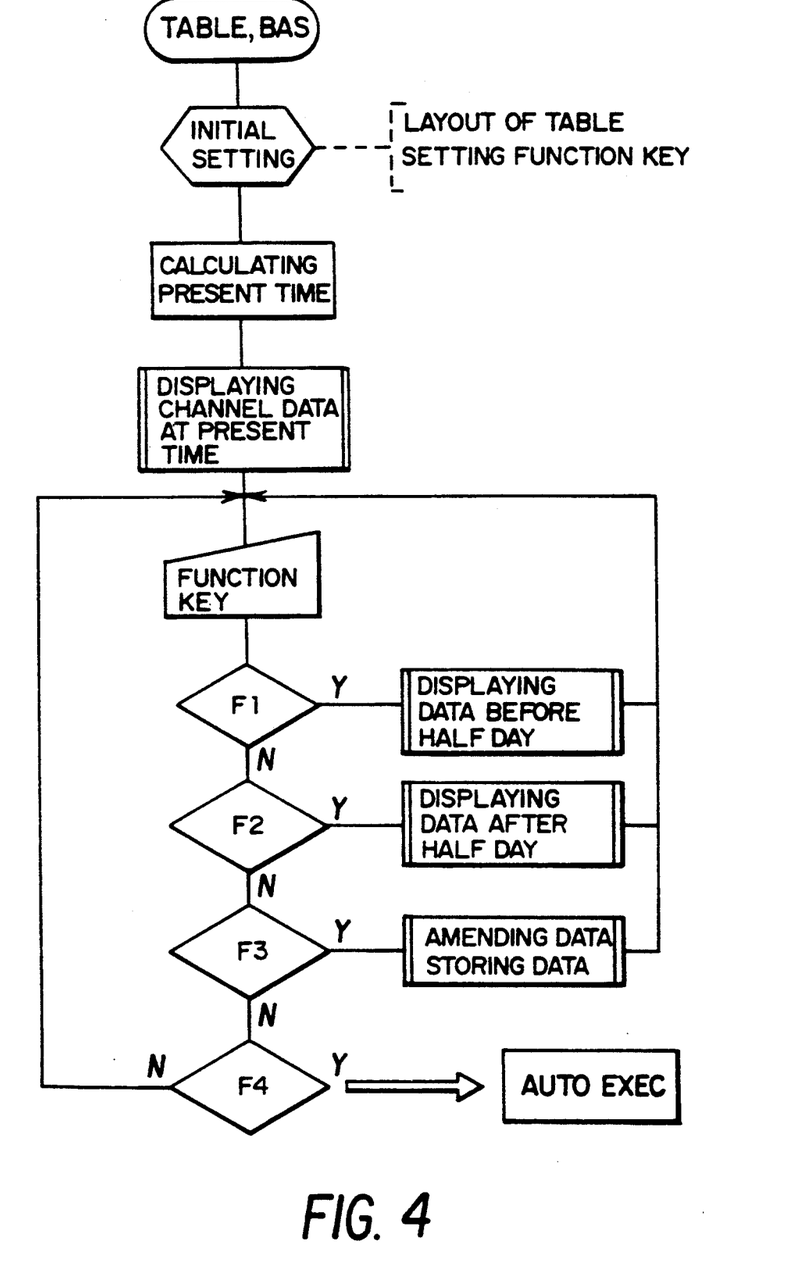
FIG. 4 is a flow chart which shows an operation of a function key of the computer of the invention.

F1, F2, F3, and F4 shown in FIG. 4 indicate that each function key on the keyboard of the computer is pushed. For example, in FIG. 4, when the function key F4 is pushed, the program returns, reversing the channel data, or changing to displaying of data of the TV program to telecasting of a TV program. As above, in this system, the channel which fits an interest of each person each time is selected for all the TV programs by the computer, and is displayed every fifteen minutes for twenty four hours. As a result, the channel number stored in the floppy diskette is always displayed on the display device, not only when the VCR is automatically controlled, but also when the TV viewer watches randomly TV programs by manual operation. Accordingly, it is not necessary to consider whether to switch between the manual operation and the automatic operation; it is enough to create attention by providing an alarm for several seconds when the channel displayed changes. This operation will be described in accordance with FIG. 5. The fact that the above system is applied to twenty four hour reservation system which does not rely upon a linear programming has already been described.

The second and the third reservation systems of several hours or several channels will now be described. This system is not the same twenty four hour display system as the first system, and reserves the TV program only several hours in one day, and the time for reservation becomes about one-half compared with manual controlling in the house. Accordingly, when it is the reserved time of each person watching the TV, in order not to miss the reserved time it is practically necessary not only to display it but also to warn it by an alarm. When the reservation of the VCR is released and the TV program is watched by manual operation, it is necessary to inform the next reserved time by the alarm and the display.

Figure 5:
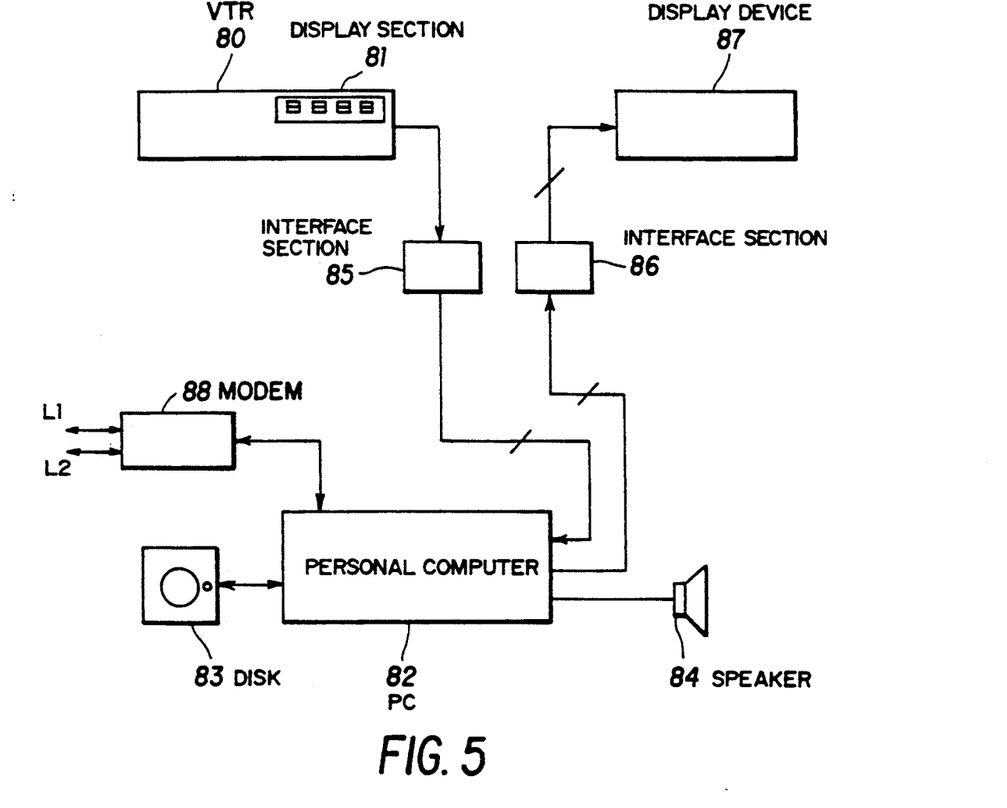
FIG. 5 is a block diagram of a second preferred embodiment of the invention.

FIG. 5 is a block view of reservation system using a general VCR. In FIG. 5, numeral 80 denotes a VCR. Numeral 81 denotes a display section of the channel, clock, etc. Numeral 82 denotes a personal computer (hereinafter PC). Numeral 83 denotes a disk which stores a program of a reserved data (which will be described later). Numeral 84 denotes a speaker set in the PC, and is used for amplifying a signal sound which will be described later. Numeral 85 denotes an interface section, and is comprised of an IC 8255 type IC. The PC reads the channel and time information displayed on the display section 81 through the interface section 85. Numeral 86 denotes a similar interface section and is used to send corresponding channel information to a display device 87 when it is a reserved time to be described later Numeral 87 denotes the display device, and is comprised of a light emitting diode which displays a number, a decoder, a latch, and displays the channel information as above.

Figure 6:
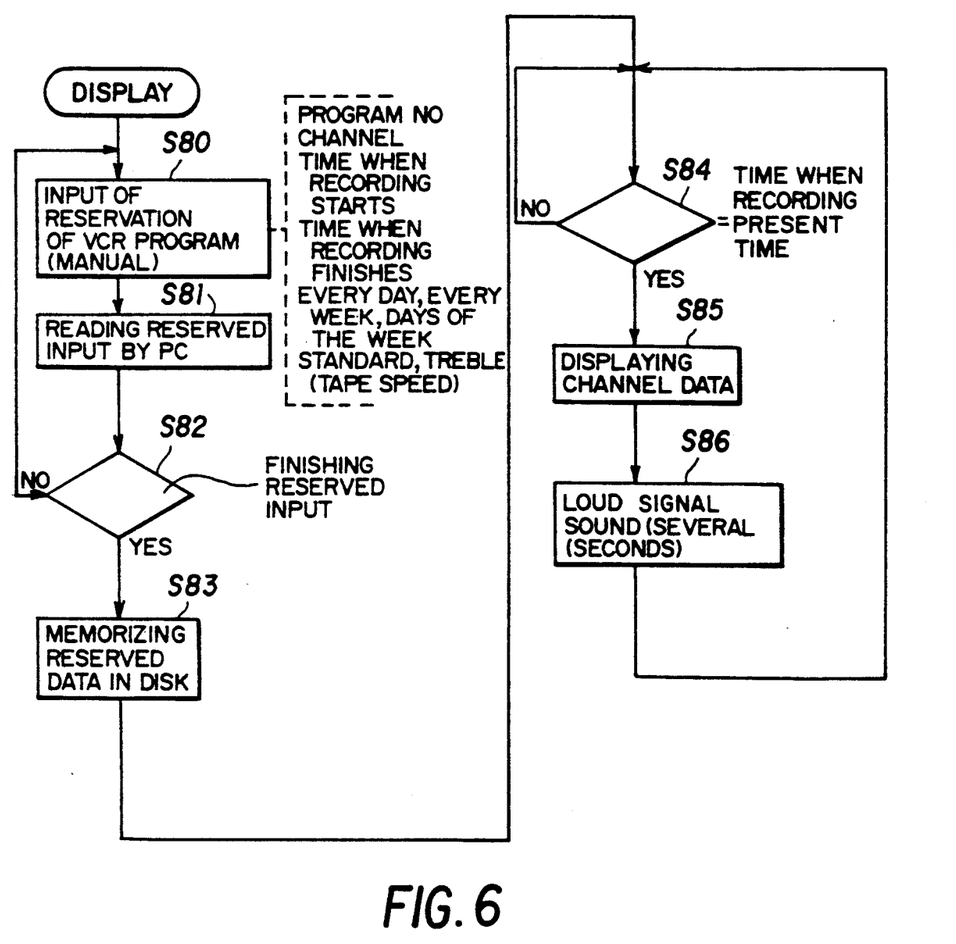
FIG. 6 is a flow chart which shows an operation of the second preferred embodiment of the invention.

Operation will now be described in accordance with the flow chart in FIG. 6. In S80, the TV program of a VCR is input by manual operation. As a general VCR can reserve eight TV programs, the TV program number, the channel, the time when recording starts, the time when recording is finished, and whether the TV program is recorded every day or every week or on the specific days of the week are input by a well known process, using plural reservation buttons set on the VCR in FIG. 5. A standard or treble speed of the tape is also input. These input elements are input in accordance with the order corresponding to the VCR used, and are displayed on the display section 81 so that they can be confirmed. When one of the reservation buttons is pushed, an interruption signal is output, and as a result, the displayed data is read by the PC 82 through the interface section 85, and is stored in the memory of the PC (step S81).

The above operation is explained in detail as follows. The data of the channel, the time when recording starts, etc. as a group of each program number, are stored in the memory in a specific order. Accordingly, when a mistake of the reservation is noticed, and the program number is revised, it is possible to revise the mistake of the reservation while keeping other data of the program number the same. When input of all the reservations is finished, a button for the reservation mode is released. The program checks the operation in the step S82.

In the next step S83, the reserved data stored in the memory in the PC 82, as above, is transmitted to the disk 83, and is stored in the disk 83. This operation is a countermeasure for losing stored reservation data upon an electric power failure. Accordingly, the reservation data in the disk is read out when the power source of PC 82 shifts from OFF to ON, and is stored in the memory (not shown in the figure).

The operation after the step S84 is in accordance with the reserved data stored in the memory. In step S84, it is checked whether the time when recording starts equals the present time. Namely, the program compares the present time shown by a clock set in the PC 82 with the time when recording starts (including days of the week) of each program number stored in the memory as above. When the present time coincides with the time when recording starts, the program is affirmed and shifts to step S85.

In step S85, the channel data of the corresponding program number is read out from the memory, and is displayed on the display device 87 through the interface section 86. The signal sound calls a person's attention to the time of a TV program (step S86). At this time, when the TV viewer wants to record the TV program which has been already reserved, the VCR is switched to the recording mode by manual operation. The program returns from step S86 to step S84. Accordingly, when it is the time when the recording starts, the program displays the next reserved channel on the display device and the signal sound is amplified as above.

A system for confirming some information of the channel, etc., displayed on the display device 87 from an outside telephone by connecting a modem 88 with the PC 82 of this invention will be now described in detail. Namely, an owner who is out calls the modem 88 by connecting directly or indirectly a portable small size computer (not shown in the figure) with the telephone ect. After the telephone line is closed by the above operation, the user inputs a secret number set previously for preventing mischievous calls in through the portable small size computer. Next, when the number "0" is input by using the keyboard, the program in the PC 82 reads out the present channel from the disk 83 through the PC 82. The information as data is sent to the portable small size computer through the modem 88, and is displayed on a display section of the portable small size computer by a program in the portable small size computer. When the number "30" is input by pushing the keyboard of the portable small size computer, the channel data after thirty minutes is displayed on the display section of the portable small size computer. The owner who is out can use a tone type telephone set as a substitute for the portable small size computer. In order to use the tone type telephone set as the substitute for the portable small size computer, the system side of the invention must have a closing means, a tone decoder for decoding a tone form the telephone set, and a speech synthesis means. As a result, the channel data can be sent to the owner who is out as a voice by speech synthesis. In this regard, in U.S. Pat. No. 4,745,549 (based on Japanese Patent Application No. 60-126432, Laid-Open Publication No. 61-284121) by the same applicant as that of this application, a time table is typed out finally from a host computer, and a disk is made by inputting the time table to the MSX-2, and the disk is sent to users in each family. The user sets the disk sent to the MSX-2 owned by each user, and operates the display device by an instruction from the disk in the MSX-2. This system is operated after the time table is typed out by a computer center.

Thereafter, each TV viewer operates a revision etc. of the channel data. However, the time table is sent to a cable television center, and the cable television center sends the data of the time table to the display device which is had by a TV viewer of each family through the cable. As a result, it is possible to display directly the channel data on the display device by sending a data signal from the cable television center without using a personal computer in the home. This means that data is sent at the same time to many TV viewers and that the signal is directly sent form the cable television center to the display device.

It is difficult to send data at the same time to many TV viewers, even if a coaxial cable is used. Accordingly, it is necessary to store temporarily the data in a buffer circuit of a subscriber in each family at the suitable time, so that the data previously stored in the buffer circuit is displayed when it is the time when the data is necessary. The above operation will be described in accordance with FIG. 7–FIG. 9.

Figure 7:
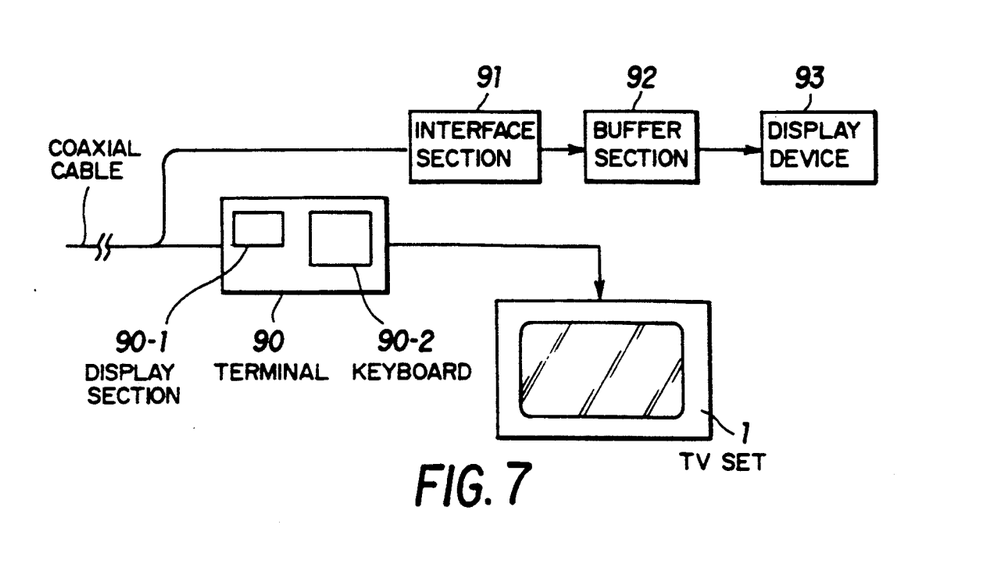
FIG. 7 is a block diagram of a third preferred embodiment of the invention.

In FIG. 7, numeral 1 denotes a TV set, and 90 denotes a terminal having bidirectional communication. Numeral 90-1 denotes a display section in the terminal 90, and 90-2 denotes a keyboard in the terminal 90, and 91 denotes an interface section. Numeral 92 denotes a buffer circuit having a memory, and numeral 93 denotes a display section. The subscriber of the cable television inputs the time table data by using the keyboard 90-2. The data can be confirmed by the display section 90-1. After input of the time table data for several hours is finished, the specific key on the keyboard 90-2 is pushed, and as a result, the time table data comprising the format shown in FIG. 9 (for example) is sent to the cable television center through a service channel.

Figure 8:
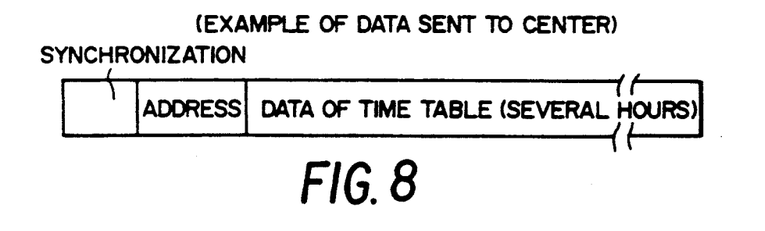
FIGS. 8 and 9 are explanatory views of a signal format of the third preferred embodiment of the invention.

In FIG. 8, "synchronization" means a signal which corresponds to the beginning point of data, and "address" means a discrimination signal of a subscriber's terminal. A polling computer (not shown in the figure) is set in the cable center. This polling computer sends repeatedly data to the subscriber's terminal and collects the data (about the channel etc. which is viewed by the subscriber). At the same time, it is possible to collect time table data when the polling computer collects the data. The cable center transmits the data collected through the polling computer to a host computer (not shown in the figure). The data is processed within the host computer, and the data of about one hour time table is sent every hour through the polling computer and the service channel, and is stored in the memory of the buffer circuit 92 through the interface section 91.

Figure 9:
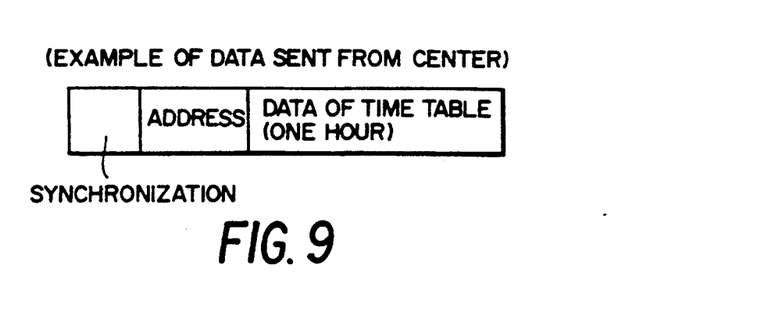

An example of the data format from the cable center is shown in FIG. 9. The display device 93 displays the channel data every fifteen minute interval in accordance with the data. When a display of the channel for one hour is finished, the data about the next one hour time table is sent from the cable center.

It is possible to combine the interface section 91, the buffer section 92, and the display section 93 in the terminal 90, because they have many common parts and circuits.

It is very important whether the TV viewer utilizes the reservation system or not, because if the TV viewer does not utilize the reservation system, the reservation system is valueless. Thus a reservation system by which it is easy to select the reservation must be provided Accordingly, this invention adopts a reservation system which displays the most suitable channel data to each person at the present time on the display device utilized or selected easily by the TV viewer in all kinds of reservation systems. This is an objective of this invention.

As the above explanation, each person can confirm easily the display in the twenty four hour reservation system or the several hour reservation system. In the person's display, when the system is not the twenty four hour reservation system, and it is the reservation time in the manual operation mode, the channel number is displayed, and the alarm can be made at the same time. As a result, this invention can improve a practical effect in the TV program reservation system.

In this disclosure, there is shown and described only the preferred embodiment of the invention, but, as aforementioned, it is to be understood that the invention is capable of use in various other combinations and environments and is capable of changes or modifications within the scope of the invention concept as expressed herein.

What is claimed is:

1. For a computer controlled TV program reservation system selecting automatically, among all TV programs based on information supplied to a central station by a viewer, a TV program which is most suitable to the viewer's taste and storing reservation time and channel data automatically selected in a VCR, a display system, comprising:

a display unit at a TV set of a viewer and separate from said TV set;

means for reading out from said VCR and displaying on said display unit for a predetermined interval of time (e.g., 15 minute interval), said stored reservation time and channel data; and means for determining when a recording start time of said VCR has arrived by comparing said reservation time data stored in said VCR with current real time, and in response, controlling said display unit to display the channel data of a TV program automatically selected by said reservation system and to generate an alarm signal to the viewer.

2. A personal channel display device in a TV program reservation system, according to claim 1, wherein said display means comprises a plurality of display portions and means for simultaneously displaying on each display portion an individual's reserved program channel designation corresponding to a respective time interval of a plurality of consecutive time intervals.

3. A personal channel display device in a TV program reservation system, according to claim 2, wherein said time interval comprises fifteen minutes and the display of the earliest interval corresponds to the current time interval.

4. The display unit of claim 1, including means for supplying, over telephone lines to a user at a remote location, an indication of channel data displayed by said display unit.

5. The display unit of claim 4, wherein said indication is provided by a synthesized voice signal.

6. A personal channel display device in a TV program reservation system, according to claim 1, wherein said display portions are divided into two sections when all TV programs are classified into two digits, up to a maximum of 99, so that it is possible to display on the first portion the channel number, for instance, 6, on the second portion the class number, for instance, 22, and on the third and fourth portions the channel and class numbers at the next time, for instance, 4 for the channel and 17 for the class, respectively.

7. A personal channel display device in a TV program reservation system, according to claim 1, wherein said display unit is divided into a plurality of portions, a reserved channel of a respective family member is displayed simultaneously on each of said portions, whereby each member of the family can easily select his or her desired channel.

* * * * *